United States Patent [19]

Hashishita

[11] Patent Number: 4,771,329
[45] Date of Patent: Sep. 13, 1988

[54] WIRINGS IN SEMICONDUCTOR INTEGRATED CIRCUIT AND METHOD THEREOF

[75] Inventor: Ryuichi Hashishita, Tokyo, Japan

[73] Assignee: NEC Corporation, Tokyo, Japan

[21] Appl. No.: 843,351

[22] Filed: Mar. 24, 1986

[30] Foreign Application Priority Data

Mar. 22, 1985 [JP] Japan .................................. 60-578147

[51] Int. Cl.[4] .................... H01L 23/52; H01L 29/40
[52] U.S. Cl. ......................................... 357/71; 357/45
[58] Field of Search .................................. 357/45, 71

[56] References Cited

U.S. PATENT DOCUMENTS 3,312,871  4/1967  Seki et al. ........................... 357/45

FOREIGN PATENT DOCUMENTS 2736290  2/1978  Fed. Rep. of Germany ........ 357/45
60-16444  1/1985  Japan ..................................... 357/45

*Primary Examiner*—Andrew J. James
*Assistant Examiner*—John Lamont
*Attorney, Agent, or Firm*—Sughrue, Mion, Zinn, Macpeak & Seas

[57] ABSTRACT

In a semiconductor integrated circuit having a double-layered wiring construction, wirings between adjacent logic function blocks of the circuit are provided using first level wirings of the double-layered wiring construction, and wirings among logic function blocks or between two logic function blocks having at least one intervening logic function block are provided by second level wirings of the double-layered wiring construction.

4 Claims, 7 Drawing Sheets

WIRINGS IN SEMICONDUCTOR INTEGRATED CIRCUIT AND METHOD THEREOF

BACKGROUND OF THE INVENTION

1. Field of the Invention

The present invention relates to the wiring of an semiconductor integrated circuit and a method thereof, and particularly to the wirings of a double-layered wiring construction of semiconductor integrated circuit, and to a method thereof.

2. Description of the Prior Art

Conventionally, semiconductor integrated circuits have many logic function blocks each made of a plurality of transistors and the like. In order to provide mutual metallic-wirings or conductive connections among the logic function blocks, double-layered wiring constructions are provided in such semiconductor integrated circuits. In the double-layered wiring construction, there are provided first level metallic-wirings and second level metallic-wirings. The first level metallic-wirings of the doouble-layered construction are lower layers formed adjacent to the semiconductor substrate. The second level metallic-wirings of the double-layered construction are upper layers separated through insulating layers formed on the first level metallic-wirings. Further, there are provided horizontal metallic wiring tracks and vertical metallic wiring tracks for assisting in forming the mutual connections among the logic function blocks using first and second level wirings.

With the above arrangement, for example, a connection or wiring between function blocks in a horizontal direction is effected using a first level metallic-wiring while a connection or wiring between function blocks in a vertical direction is effected using a second level metallic-wiring.

Thus, according to conventional connection or wiring techniques as employed in semiconductor integrated circuits, the first and second level metallic-wirings of the double-layer wiring construction are respectively employed as horizontal and vetical wiring paths, their deposition being aided by the horizontal and vertical metallic tracks.

Accordingly, the connections or wirings between function blocks have been provided by a combination or first and second level wirings. Further, if a connection among three or more function blocks or a connection between two function blocks having an intervening function block therebetween is required using the same level metallic-wiring as that which is employed in the internal metallic-wiring of the function block to be connected, the same level metallic wiring is not able to pass through the internal metallic-wiring disposed in the function block to be connected. In such instances, it is necessary to dispose an extra wiring region such as a horizontal or vertical metallic track, out of that function block areas, and to route the extra wiring region into the function blocks to be connected.

As is clear from the above description, conventional wirings of the double-layered wiring construction disadvantageously complicate wiring arrangement and increase semiconductor chip area.

SUMMARY OF THE INVENTION

In order to eliminate the above disadvantages, an object of the present invention is to provide novel wirings of a double-layered construction in semiconductor integrated circuit having a plurality of logic function block, and a method thereof.

The present invention is characterized in that only first level metallic-wirings of the double-layered wiring construction are used for mutual wirings between adjacent logic function blocks, and second level metallic-wirings of the double-layered wiring construction are used for mutual wiring among three or more logic function blocks or between two logic function blocks having at least one intervening logic function block therebetween.

With the wiring arrangement of the invention, the first level metallic-wiring between adjacent function blocks having respective internal wirings is obtained without extra wiring regions since leads of terminals for forming the first level wirings can be extended to the edges of the function blocks to be connected. As a result, the second level metallic-wirings can be arbitrarily arranged in the double-layered wiring construction independently of the first level metallic-wirings and the internal wirings within function blocks. Accordingly, the second level metallic-wirings are provided for connecting among three or more function blocks or between adjacent two function blocks having at least one intervening function block therebetween, without extra wiring regions.

DETAILED DESCRIPTION OF THE PREFERRED EMBODIMENTS

Preferred embodiments according to the present invention will be described in detail with reference to the accompanying drawings.

Figure 1:
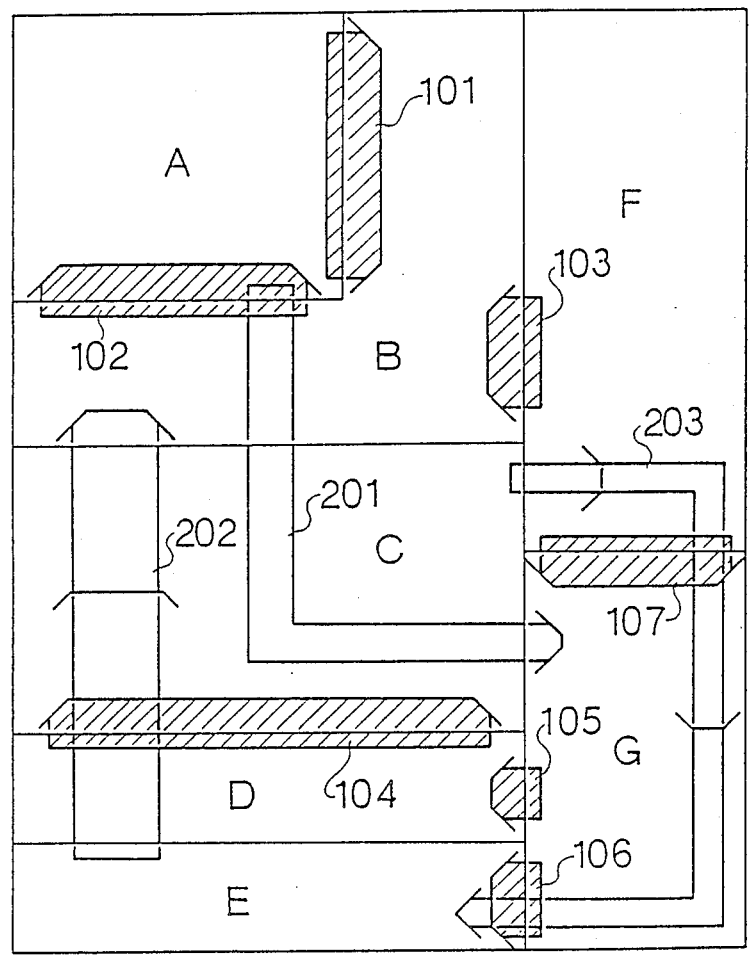
FIG. 1 is a diagram showing a wiring pattern of a first embodiment of the present invention.

FIG. 1 is a schematic plan view showing a wiring pattern according to a first embodiment of the invention.

In FIG. 1, logic function blocks formed in a semiconductor integrated circuit are respectively designated by A, B, C, D, E, F, and G. Each of the logic function blocks is made of a plurality of active elements, for example, transistors. Internal wirings or connections within the function blocks are made using the respective first level metallic-wirings of the double-layered construction.

In FIG. 1, a metallic-wiring group designated by 101 is disposed to connect the function block A to the function block 3, a metallic-wiring group 102 is disposed to connect function block B to A, a metallic-wiring group 103 is disposed to connect the function block F to B, a metallic-wiring group 104 is disposed to connect the function block D to C, a metallic-wiring group 105 is disposed to connect the function block G to D, a metallic-wiring group 106 is disposed to connect the function block G to E, and a metallic-wiring group 107 is disposed to connect the function block F to G. Each metallic-wiring group is shown in this drawing by an arrowhead strip. The arrow indicates the signal current direction and the connection between the corresponding function block to be connected.

In the above described arrangement, each pair of two function blocks connected by the metallic-wiring groups 101, 102, 103, 104, 105, 106 or 107 is adjacent. Therefore, all of the metallic-wiring groups disposed in this arrangement are provided using the first level metallic-wiring of the double-layered wiring construction according to the present invention.

Furthermore, in FIG. 1, a metallic-wiring group 201 is disposed to connect the function block A to G, a metallic-wiring group 202 is disposed to connect among the function blocks E, C and A, and a metallic-wiring group 203 is disposed to mutually connect among the function blocks C, F, G and E. All of the metallic-wiring groups disposed in this second arrangement are provided using the second level metallic-wirings of the double-layered wiring construction.

As is clear from the above embodiment, in the case of wirings between the two adjacent function blocks, if the terminals of one function block are made to coincide with those of the other function block to be connected thereto, extra wiring regions are not required for the first level metallic-wiring therebetween. In the case of wirings among three or more function blocks, the second level metallic-wirings such as the metallic-wiring groups 202 and 203 are extended for the required connections, independent of first level metallic-wirings or internal wirings. Alternatively, in the case of wirings between function blocks having at least one intervening function block not to be connected there, the second level metallic-wiring such as the metallic-wiring group 201 is able to traverse the intervening function block C.

As described above, the first level and the second level metallic-wirings are applicable irrespective of the horizontal and vertical directions. Therefore, extra wiring regions are not required.

Figure 2:
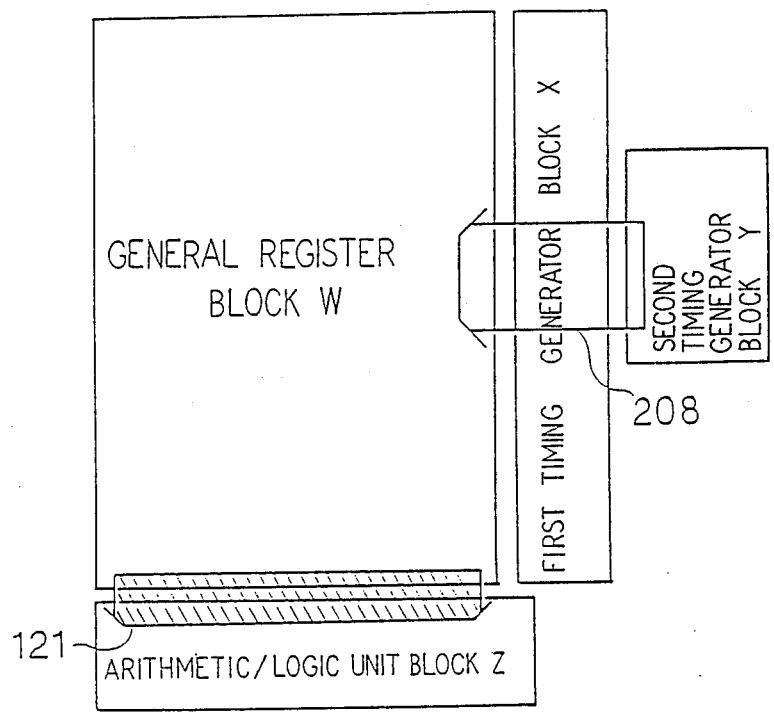
FIG. 2 is a diagram showing a wiring pattern among logic function blocks implementing the first embodiment in FIG. 1.

FIG. 2 is diagram showing the wiring pattern between logic function blocks in a semiconductor chip wired according to the first embodiment.

FIG. 2, a general register block is designated by W, a first timing generator block is designated by X, a second timing generator block is designated by Y, and a arithmetic/logic unit (ALU) block is designated by Z. All are logic function blocks.

Figure 3:
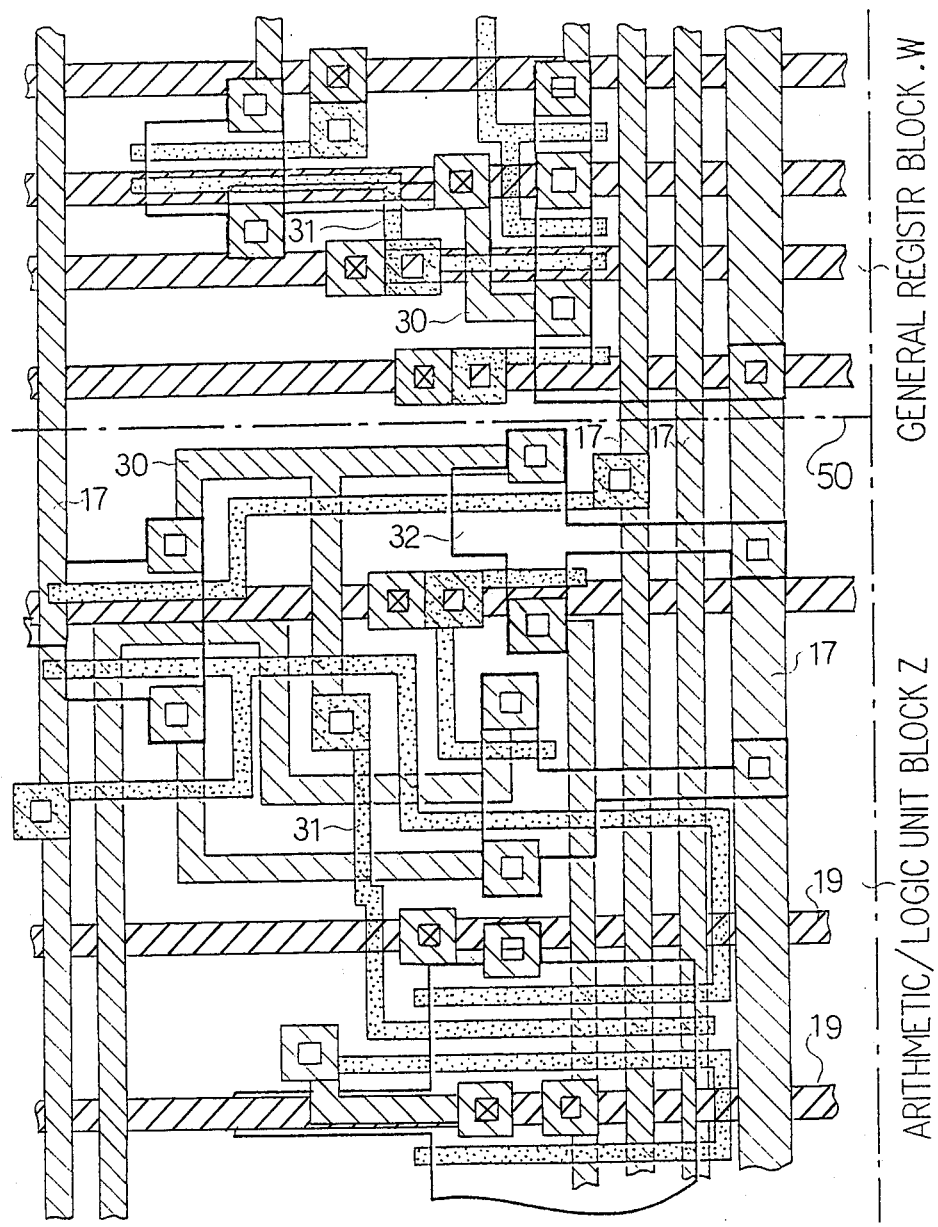
FIG. 3 is a diagram showing a part of a mask pattern provided between the function blocks W and z in FIG. 2.

As is clear from the diagram, the general register block W and the ALU block Z are adjacent to each other so that the first level metallic-wiring of the double-layered wiring construction is provided as a metallic-wiring group, designated by 121, for connection therebetween. FIG. 3 is a diagram showing a mask pattern of part of this first level metallic-wiring, with the second level metallic-wiring also being illustrated.

Figure 4:
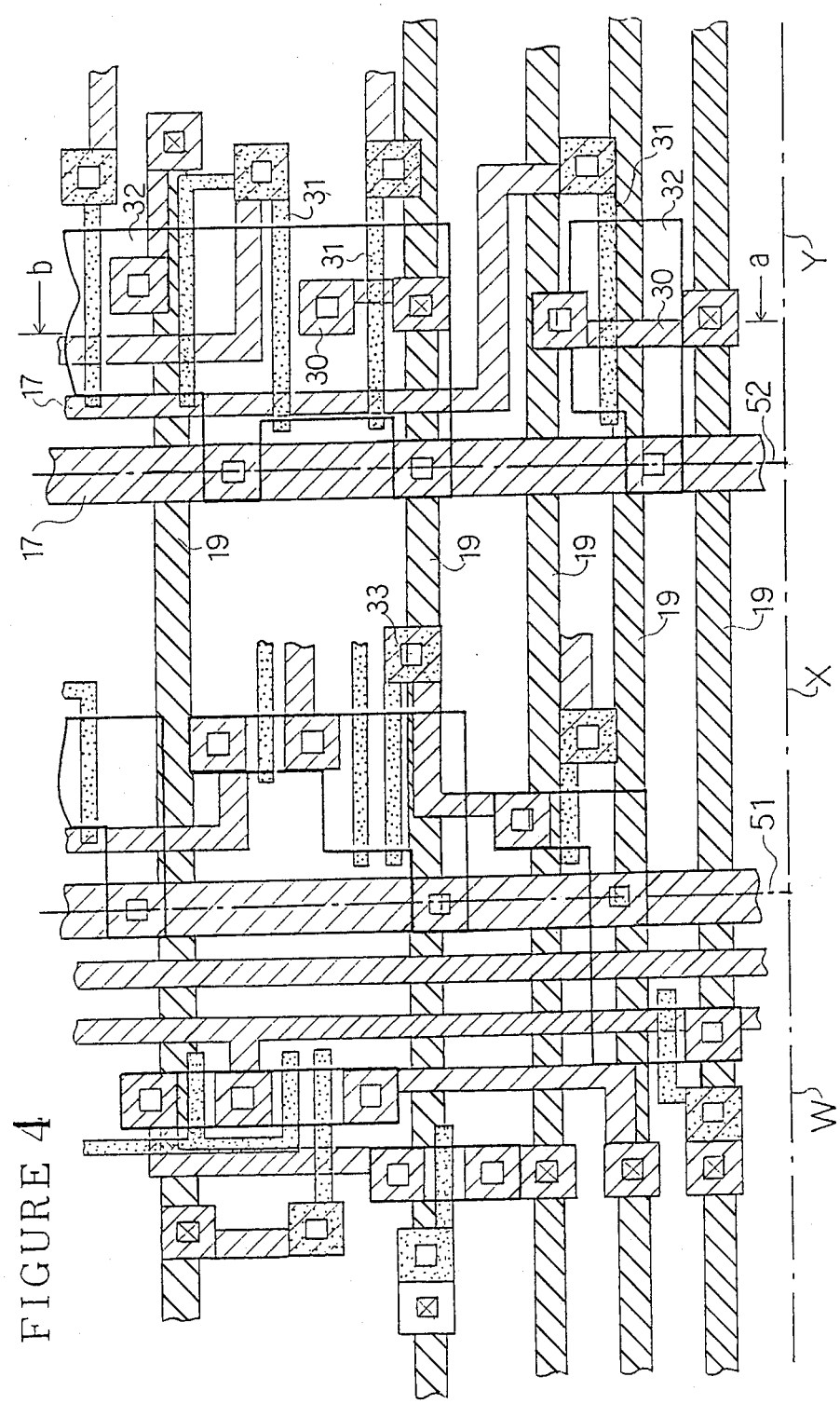
FIG. 4 is a diagram showing a part of a mask pattern provided between the function blocks W and Y having the intervening function block X therebetween in FIG. 2.

Further, the timing generator block X intervenes between the general register block W and the second timing generator block Y so that second level metallic-wiring is provide as a metallic-wiring group, designated by 208, between the second timing generator block Y and the general register block W. FIG. 4 is a diagram showing a mask pattern of part of this second level metallic-wiring, with the first level metallic-wiring also being illustrated. Further, FIG. 5 is a sectional view taken along the a-b line in FIG. 4.

Figure 5:
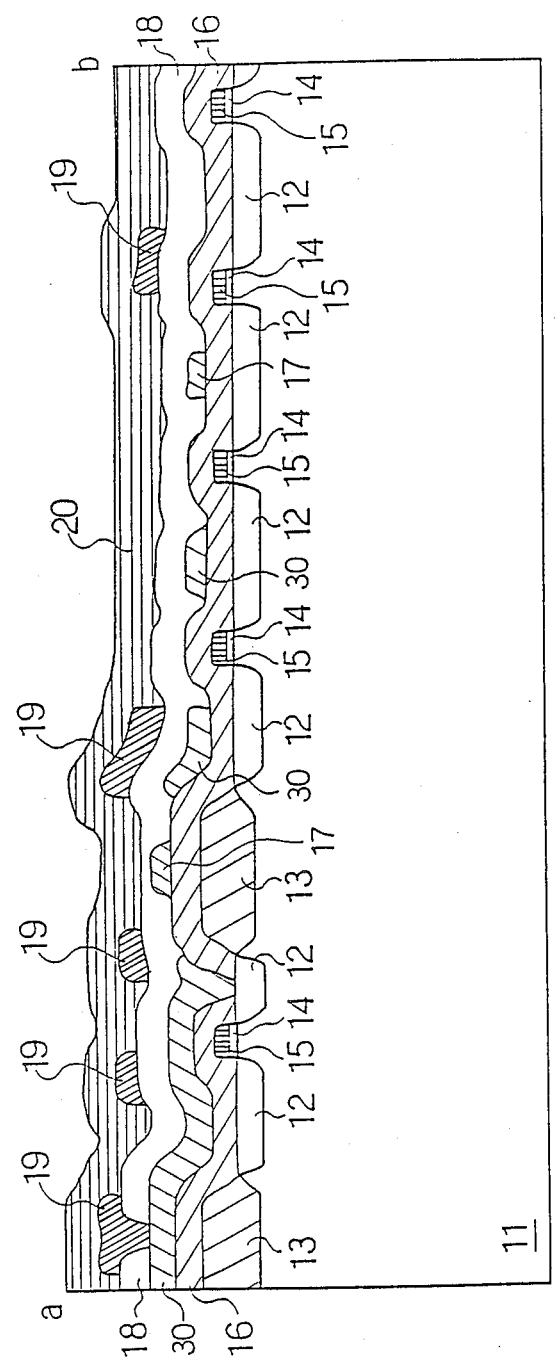
FIG. 5 is a diagram showing a sectional view taken along the line a-b in FIG. 4.

In FIGS. 3 through 5, metallic-wirings are made of aluminum. The first level metallic-wirings are indicated by a thin single-hatched line while the second level metallic-wirings are indicated by more broadly hatched lines.

From FIG. 3, it is clear that first level aluminum wirings indicated by thin single-hatched line are extended beyond line 50 which defines the border between the general register block W and the ALU block Z.

In FIG. 4, the general register block W and the first timing generator block X are separated by a border line 51 and the first timing generator block X and the second timing generator block Y are separated by a border line 52. From FIG. 4, it is clear that the second level aluminum wirings indicated by broadly-hatched lines are provided for the connection, through respective through-holes, between the general register block W and the second timing generator block Y, while the second level wirings traverse the first timing generator block X. However, one of the second level aluminum wirings traversing the first timing generator block X, if necessary, may be connected through a contact 33 to a polysilicon gate of the first timing generator block X without connection to the first level aluminum wirings.

In FIG. 5, there are illustrated transistor elements separated on a semiconductor substrate 11 by thick insulating layers 13 which are partly embedded in the semiconductor substrate 11. Each of the transistor elements comprises two diffusion layers 12 and a gate region formed of a gate oxide layer 14 and a polysilicon gate 15 thereon. A first insulation layer 16 is formed on the thus arranged transistor elements on the semiconductor substrate 11, and first level aluminum wirings 17 and internal metallic-wirings 30 are formed thereon. For example, a first level internal aluminum wiring 30 is connected through a through-hole formed in the first insulation layer 16 to the diffusion layer 12. The second level aluminum wirings 19 are formed on second insulation layers 18 which are formed over the first level aluminum wirings 17 and internal wirings 30. For example, the second level aluminum wiring 19 may be connected through a through-hole formed in the second insulation layer 18 to the first level internal wiring 30. Finally, a passivation layer 20 is formed over the entire upper surface of the above construction. From FIG. 5, it is clear that the internal wirings 30 within a single function block are disposed so as to be connected to polysilicon gate wirings 31 as shown in FIGS. 3 and 4, with the diffusion layers 12 constituting the source and drain of the transistor element. Alternatively, the internal wirings 30 may be connected to the second level aluminum wirings 19. Along with the first level aluminum wirings 17 mutually connecting two adjacent function blocks, the internal wiring 30 constitute the first level metallic-wirings of the double-layered wiring construction.

Furthermore, as shown in FIG. 3, the first level aluminum wirings 17 extend in a first direction only to the adjacent function blocks so as to be connected thereto while the second level aluminum wirings 19 extend in a perpendicular direction there or more adjacent function blocks so as to be connected thereto, or traverse an immediately adjacent function block so as to be connected to the following function blocks.

On the other hand, as shown in FIG. 4, the second level aluminum wirings 19 extend in a first direction so as to traverse the first timing generator block X and connect the general register block W and the second timing generator block Y, while the first level aluminum wirings 17 extend in a perpendicular direction so as to connect the immediately adjacent function blocks.

As shown in FIG. 5, the internal wirings 30 and the first level aluminum wirings 17 are clearly separated from the second level aluminum wirings 19 according to the present invention.

Figure 6:
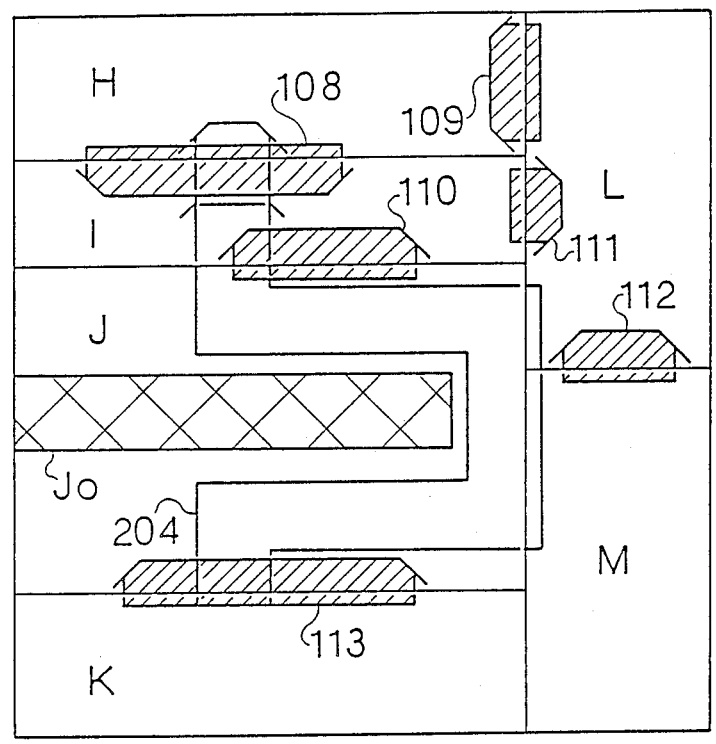
FIG. 6 is a diagram showing a wiring pattern of a second embodiment of the present invention; and, FIG. 7 is a diagram showing a wiring pattern of a third embodiment of the present invention.

FIG. 6 is a schematic plan view showing a wiring pattern of a second embodiment according to the present invention.

In FIG. 6, six logic function blocks are provided and are respectively designated by H, I, J, K, L and M. Five function blocks H, I, K, L and M are respectively designated to use first level metallic-wirings of a double-layered wiring construction as internal wirings within the respective function blocks. On the other hand, the function block J is designated to have both first and second level metallic-wirings as internal wirings.

In FIG. 6, a metallic-wiring group designated by 108 is disposed to connect the function blocks H and I, a metallic-wiring group designated by 109 is disposed to connect the function blocks L and H, a metallic-wiring group designated by 110 is disposed to connect the function blocks J and I, a metallic-wiring group designated by 111 is disposed to connect the function blocks I and L, a metallic-wiring group designated by 112 is disposed to connect the function blocks M and L, and a metallic-wiring group designated by 113 is disposed to connect the function blocks K and J. In this arrangement, the two function blocks to be thus connected are adjacent to each other, so that the interconnecting metallic-wiring groups are all first level metallic-wirings.

Further, a metallic-wiring group designated by 204 is disposed to mutually connect the function blocks K, I and H. The wiring group 204 is a second level metallic-wiring.

However, the function block J has a second level metallic-wiring region designated by Jo thereon. Therefore, the second level metallic-wiring group 204 can not extend straight from the function block K to I (or H). Here, the second level wiring region Jo is regarded as a passage-inhibited region of the second level metallic-wiring. The metallic-wiring group 204 is disposed to around the passage-inhibited region Jo, but so as to minimize the so extra wiring region.

Figure 7:
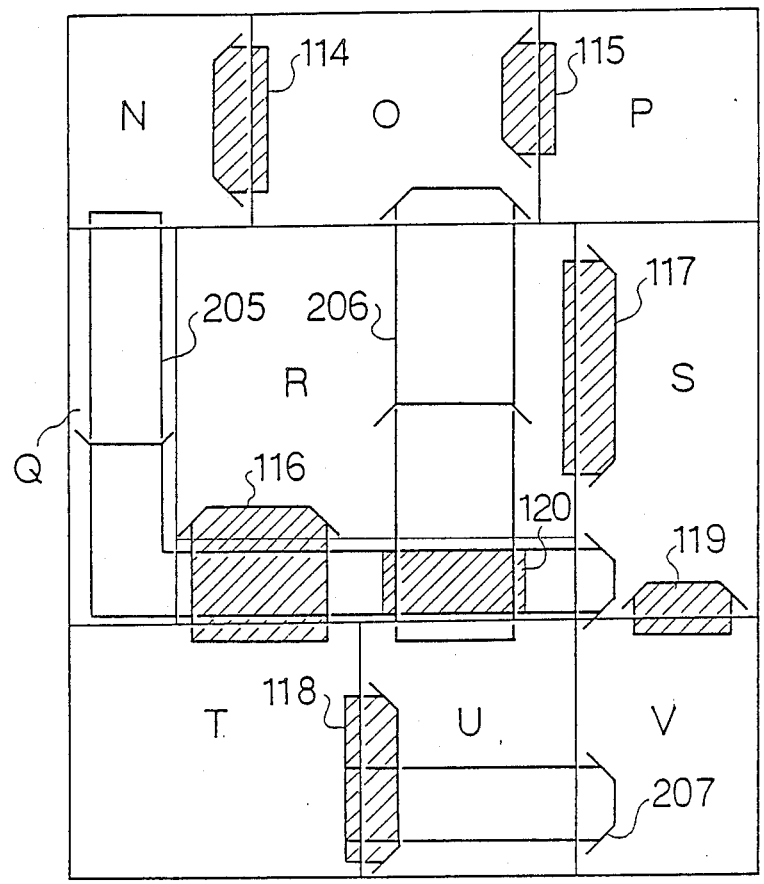

FIG. 7 is a schematic diagram of wiring pattern of a third embodiment.

In FIG. 7, nine logic function blocks are provided and are respectively designated by N, O, P, Q, R, S, T, U and V. All of the nine functions blocks use first level metallic-wirings as their respective internal wirings.

In FIG. 7, a metallic-wiring group designated by 114 is disposed to connect the function blocks O and N, a metallic-wiring group designated by 115 is disposed to connect the function blocks P and O, a metallic-wiring group designated by 116 is disposed to connect the function blocks T and R, a metallic-wiring group designated by 117 is disposed to connect the function blocks R and S, a metallic-wiring group designated by 118 is disposed to connect the function blocks T and U, and a metallic-wiring group designated by 119 is disposed to connect the function blocks V and S. In the above described arrangement, the respective function blocks to be interconnected are adjacent to each other, so that all of the metallic-wiring groups 114 to 119 first level metallic-wirings.

In FIG. 7, a metallic-wiring group designated by 205 is disposed to interconnect the function blocks N, Q and S, a metallic-wiring group designated by 206 is disposed to connect the function blocks U, R and O, and a metallic-wiring group designated by 207 is disposed to connect the function blocks T and V having an intervening function block U therebetween. All of the metallic-wiring groups 205 to 207 as described above are second level metallic-wirings according to the present invention.

However, the metallic-wiring group 205 of the second level metallic-wiring intersects the metallic-wiring group 206 of the same level wiring at a hatched portion 120 on the function block R. Therefore, a part of the metallic-wiring group 205 at the hatched portion 120 is replaced by a first level metallic-wiring, thus avoiding the intersection. In this third embodiment, logic function blocks are not provided in the area including the hatched portion 120.

As described above, the present invention is characterized by a double-layered construction, and particularly first level metallic-wirings and second level metallic-wiring made of aluminum and the like, excepting polysilicon wirings. The need of extra wiring regions can be constrained to be as small as possible according the present invention. Hence, is possible to design high density semiconductor integrated circuit chips without complicated wiring constructions.

According to the present invention, adjacent function blocks are connected using only the first level metallic-wiring of a double-layered wiring construction. Further, the interconnection of three or more logic function blocks is made using only the second level metallic-wiring of the double-layered wiring construction. Furthermore, the connection between two function blocks having at least one intervening function block therebetween is also made using only the second level metallic-wiring so as to pass above the intervening irrelative function blocks. Accordingly, it is not necessary to provide extra wiring regions as used by most conventional semiconductor integrated circuits having a double-layered wiring construction. If such an extra wiring region is used, it is possible to make such wiring region as small as possible without complicating wiring constructions.

I claim:

1. A wiring arrangement for a semiconductor integrated circuit having a plurality of logic function blocks, comprising; a double-layered metal wiring construction including a first level metal wiring provided for internal connections within each of the logic function blocks and for inter-block connections between adjacent pairs of logic function blocks; an interlayer insulation layer covering the first level metal wiring; and a second level metal wiring provided over said insulation layer for making connections among at least non-adjacent logic function blocks having at least one intervening logic function block therebetween, said second level metal wiring extending over at least a portion of at least one of the internal connections made by said first level metal wiring in the intervening logic function block and the inter-block connections made by said first level metal wiring and extending from the intervening logic function block.

2. A wiring arrangement for a semiconductor integrated circuit having a plurality of logic function blocks, comprising; a double-layered metal wiring construction including a first level metal wiring provided for internal connections within each of the logic function blocks and for connections between adjacent pairs of logic function blocks; an interlayer insulation layer covering the first level metal wiring; said interlayer insulation layer supporting a first second level metal wiring for making connections among at least non-adjacent logic function blocks having at least one intervening logic function block which includes internal connections composed of the first-level wiring, and a second second level wiring; said first second level wiring extending over at least a portion of the first level metal wiring within the intervening logic function block, and being insulated from the second second level wiring portion of the intervening logic block.

3. A wiring arrangement for a semiconductor integrated circuit having a plurality of logic function blocks, comprising; a double-layered metal wiring construction including a first level metal wiring provided for internal connections within each of the logic function blocks and for making connections between adjacent pairs of logic function blocks; an interlayer insulation layer covering the first level metal wiring; and a second level metal wiring provided over said insulation layer for making connections among at least non-adjacent logic function blocks having at least one intervening logic function block therebetween, the second level metal wiring including (a) a first wiring portion for connecting first and second logic function blocks having a third logic function block intervened therebetween, and (b) a second wiring portion connecting fourth and fifth logic function blocks having said third logic function block intervened therebetween, the second wiring portion crossing the first wiring portion over the third logic function block, a first wiring portion crossing section of said second wiring portion being composed of first level metal wiring.

4. A wiring arrangement as claimed in claim 2, wherein said first second level wiring passes beneath said second second level wiring at crossing points thereof.

* * * * *

UNITED STATES PATENT AND TRADEMARK OFFICE
CERTIFICATE OF CORRECTION

PATENT NO. : 4,771,329

DATED : September 13, 1988

INVENTOR(S) : HASHISHITA

It is certified that error appears in the above-identified patent and that said Letters Patent is hereby corrected as shown below:

On the Title Page, Item [30], delete "60-578147" and insert --60-57814--;

Column 1, line 47, delete "or" and insert --of--.

Signed and Sealed this

Seventh Day of March, 1989

Attest:

DONALD J. QUIGG

*Attesting Officer*    *Commissioner of Patents and Trademarks*